United States Patent
Schulmann et al.

Patent Number: 5,707,447
Date of Patent: Jan. 13, 1998

[54] CRYSTAL PULLING APPARATUS

[75] Inventors: Winfried Schulmann, Kleinostheim; Johann Scholler, Eppertshausen, both of Germany

[73] Assignee: Balzers und Leybold Deutschland Holding AG, Hanau, Germany

[21] Appl. No.: 718,965

[22] Filed: Sep. 26, 1996

[30] Foreign Application Priority Data

Sep. 26, 1995 [DE] Germany .......... 195 35 750.7
Oct. 23, 1995 [DE] Germany .......... 195 39 316.3

[51] Int. Cl.$^6$ .................................. C30B 35/00
[52] U.S. Cl. .................. 117/217; 117/208; 117/222
[58] Field of Search ............................ 117/208, 213, 117/217, 222, 900

[56] References Cited

U.S. PATENT DOCUMENTS

| | | | |
|---|---|---|---|
| 3,556,732 | 1/1971 | Chang et al. | 117/208 |
| 4,956,153 | 9/1990 | Yamgishi et al. | 117/217 |
| 5,360,480 | 11/1994 | Altekrüger | 117/208 |

FOREIGN PATENT DOCUMENTS

| | | | |
|---|---|---|---|
| 0417948 | 3/1991 | European Pat. Off. | |
| 0530397 | 3/1993 | European Pat. Off. | |
| 2821481 | 11/1979 | Germany | |
| 4198086A | 7/1992 | Japan | 117/213 |
| 5254982A | 10/1993 | Japan | 117/213 |
| 5254988A | 10/1993 | Japan | 117/208 |

OTHER PUBLICATIONS

JP 06-2 93 589 A In: Patent Abstracts of Japan.

IBM Technical Disclosure Bulletin, vol. 28, No. 1, Jun. 1985, NY, pp. 211–212, XP002023174 "Aparatus for low to medium level level oxygen czochrslski silicon crystal growth".

Patent Abstracts of Japan, vol. No. 8, No. 266 (C–255 (1703) & JP-A-59 141494 (Hitach Seisakusho KK), abstract.

*Primary Examiner*—Felisa Garett
*Attorney, Agent, or Firm*—Felfe & Lynch

[57] ABSTRACT

A crystal pulling apparatus for producing a crystal boule (17) from a material melted in a crucible (4) has, in a tank (1), a heater (5) surrounding the crucible (4). The tank (1) has in the area of the crucible (4) an annular chamber (8) defined on the heater (5) side by an inner protective wall (6) and connected to the shielding gas outlet (14, 15), and on the outside by an outer protective wall (7) behind which the thermal insulation (10) of the tank (1) is located.

4 Claims, 1 Drawing Sheet

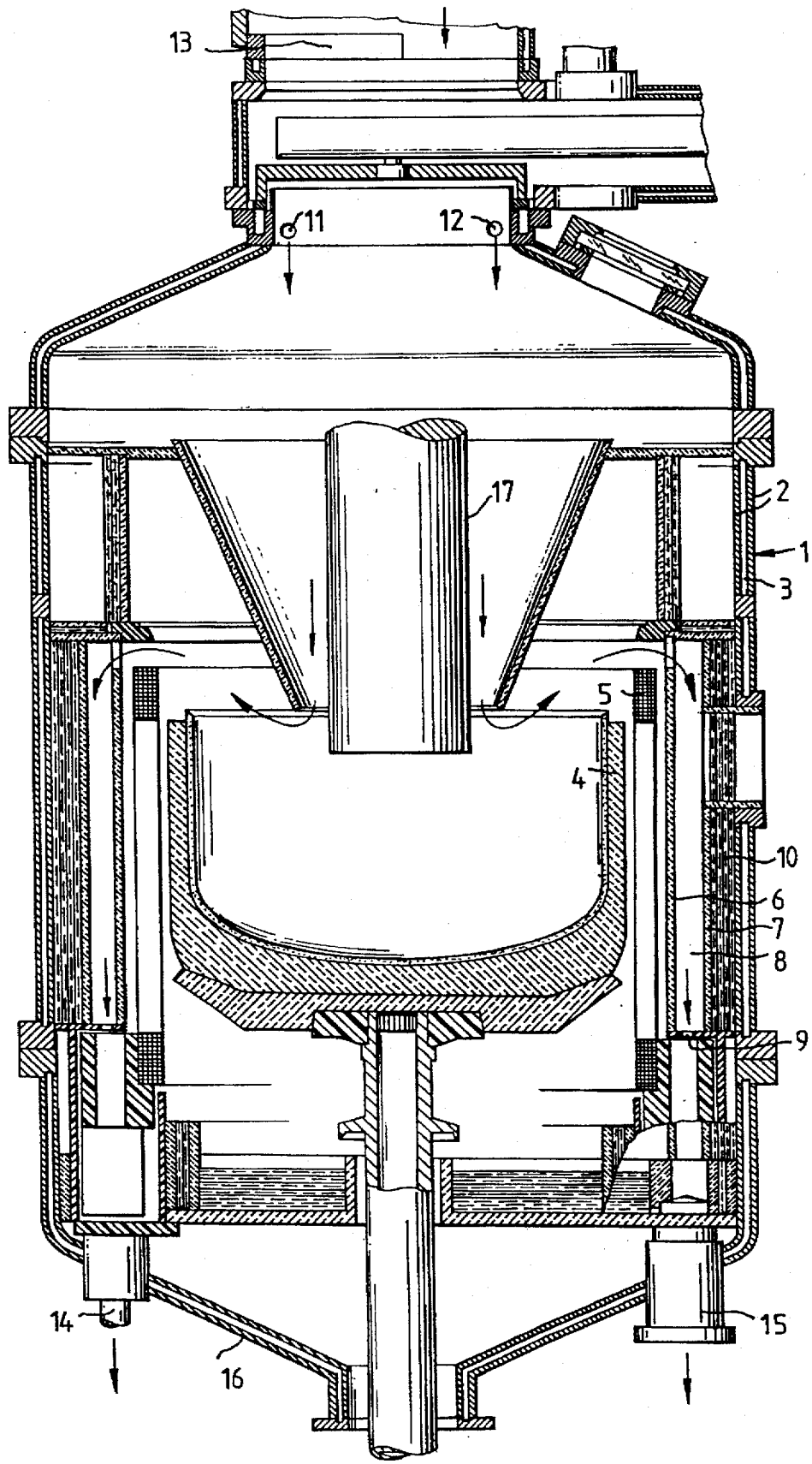

CRYSTAL PULLING APPARATUS

BACKGROUND OF THE INVENTION

The invention relates to a crystal pulling apparatus for producing a crystal boule from a material melted in a crucible surrounded by a heater and disposed in a tank whose wall is provided with thermal insulation and, external cooling passages. The tank has at least one shielding gas inlet and one shielding gas outlet.

Such crystal pulling apparatus are used especially for the production of boules of monocrystalline silicon or germanium and they are therefore known in the technical field. Argon usually serves as the shielding gas so as to block the access of oxygen. This shielding gas commonly flows above the heater into an annular chamber outside of the thermal insulation of the tank and is then carried off through this annular chamber between the thermal insulation and the cooling passages.

It has been found in practice that, in such crystal pulling apparatus, dusty substances borne by the shielding gas deposit themselves relatively rapidly on the heater and on the inner walls of the tank, so that the apparatus has to be cleaned at undesirably frequent intervals. In particular, in the production of silicon crystal boules, silicon oxide becomes deposited on the inside walls and the heater. Moreover, the power consumption of such apparatus is high.

SUMMARY OF THE INVENTION

The invention provides a crystal pulling apparatus which tends to deposit less substances on its walls and its heater, and will cause much less power consumption.

In accordance with the invention the tank has an annular chamber connected to the shielding gas outlet and defined on the heater side by an inner wall and on the outer side by an outer wall, and the thermal insulation of the tank is situated in back of the latter.

In a crystal pulling apparatus of this kind the shielding gas in the chamber is separated from the coolant by the thermal insulation. Therefore the shielding gas leaves the tank substantially hotter than in the state of the art. Thus less heat is transferred to the coolant, which is usually water, so that a lesser flow of coolant is needed. Since the shielding gas that is to be exhausted is no longer cooled by the coolant, the result is a lower rate of condensation of substances in the shielding gas, which substantially improves the service life of the apparatus, especially its heater. On account of the annular chamber around the heater there is a very uniform temperature distribution, which is advantageous for the crystal pulling operation.

An especially uniform gas flow is obtained, and with it also an especially uniform temperature distribution in the tank, if the annular chamber is defined at its bottom end by a screen plate through which there is a connection to the shielding gas outlet.

Optimum use of the space available for the arrangement of crystal pulling apparatus is obtained if the tank has in its floor two shielding gas outlets opposite one another and aligned with the axis of the tank.

In an embodiment where the inner wall reaches upward to the top edges of the heater, the shielding gas flows only against the upper end of the crucible at a fairly high velocity, while in the areas further down the shielding gas is virtually at a standstill. As a result of this limitation of the flow of shielding gas, the gas does not flow to any great extent in areas of lower temperature where the danger of condensation of entrained gaseous components is great.

BRIEF DESCRIPTION OF THE DRAWING

FIG. 1 is an axial section through a crystal pulling apparatus according to the invention.

DETAILED DESCRIPTION OF THE PREFERRED EMBODIMENT

The drawing shows a tank 1 whose wall is double, so that cooling channels 3 are present for a coolant, usually water. In the tank 1 there is a crucible 4 which is surrounded by an electrical heater 5. This heater 5 is surrounded with a slight gap by an inner wall 6 and an outer wall 7. In this manner an annular chamber 8 is formed which terminates at its bottom in a likewise annular screen plate 9. The upper edge of the inner wall 6 is at the level of the upper edge of the heater 5. Between the outer wall 7 and the wall 2 of the tank 1 there is thermal insulation 10 in the area of the crucible 4.

Schematically indicated at the upper part of the tank 1 are two shielding gas inlets 11 and 12. Through these, and at the same time through an upper opening 13, a shielding gas, usually argon, flows into the tank 1 during the operation of the crystal pulling apparatus. This shielding gas leaves the tank 1 through two exhaust outlets 14 and 15 which are provided in its bottom opposite one another and are aligned with the axis of the tank 1, and which communicate through the screen plate 9 with the annular chamber 8.

During the operation of the crystal pulling apparatus shielding gas flows downward along a schematically indicated crystal boule 17 to the upper end of the crucible 4, and from there over the heater 5 and into the annular chamber 8 from which it is carried away through the shielding gas outlets 14 and 15. The rest of the space in tank 1 is also filled with shielding gas, but the main flow follows the course described above.

We claim:

1. A crystal pulling apparatus for producing a crystal boule from a melted material, said apparatus comprising a crucible for containing said melted material, a heater surrounding said crucible, a tank in which said crucible and said heater are located, said tank being provided with thermal insulation and cooling passages externally of said insulation, and provided with thermal insulation and cooling passages externally of said insulation, and an annular chamber between said heater and said insulation, said chamber being defined by an inner wall adjacent to said heater and an outer wall adjacent to said insulation, and at least one shielding gas outlet connected to said annular chamber.

2. A crystal pulling apparatus as in claim 1 wherein said annular chamber comprises a bottom and provided with a screen plate, said at least one shielding gas outlet being connected to said annular chamber through said screen plate.

3. A crystal pulling apparatus as in claim 1 wherein said tank comprises a floor in which two said shielding gas outlets are located, said outlets being axially aligned with said tank and opposite one another.

4. A crystal pulling apparatus as in claim 1 wherein said heater has an upper edge and said inner wall extends upward to said upper edge of said heater.

* * * * *